(12) United States Patent
Braasch et al.

(10) Patent No.: US 7,752,580 B2
(45) Date of Patent: Jul. 6, 2010

(54) METHOD AND SYSTEM FOR ANALYZING AN INTEGRATED CIRCUIT BASED ON SAMPLE WINDOWS SELECTED USING AN OPEN DETERMINISTIC SEQUENCING TECHNIQUE

(75) Inventors: Sarah C. Braasch, Richmond, VT (US); Jason D. Hibbeler, Williston, VT (US); Rouwaida N. Kanj, Round Rock, TX (US); Daniel N. Maynard, Craftsbury Common, VT (US); Sani R. Nassif, Austin, TX (US); Evanthia Papadopoulou, Baldwin Place, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 11/828,728

(22) Filed: Jul. 26, 2007

(65) Prior Publication Data

US 2009/0031263 A1 Jan. 29, 2009

(51) Int. Cl.
*G06F 17/50* (2006.01)
(52) U.S. Cl. .......................................................... 716/4
(58) Field of Classification Search .................. 716/4–5
See application file for complete search history.

(56) References Cited

U.S. PATENT DOCUMENTS

| | | | |
|---|---|---|---|
| 5,754,432 A | 5/1998 | Komatsuzaki et al. |
| 6,044,208 A | 3/2000 | Papadopoulou et al. |
| 6,066,179 A | 5/2000 | Allan |
| 6,178,539 B1 | 1/2001 | Papadopoulou et al. |
| 6,229,921 B1 | 5/2001 | Wenzel et al. |
| 6,247,853 B1 | 6/2001 | Papadopoulou et al. |
| 6,311,139 B1 | 10/2001 | Kuroda et al. |
| 6,317,859 B1 | 11/2001 | Papadopoulou |
| 6,529,193 B1 | 3/2003 | Grabenstein et al. |
| 6,718,539 B1 | 4/2004 | Cohen et al. |
| 6,751,519 B1 | 6/2004 | Satya et al. |
| 6,810,510 B2 | 10/2004 | Bakarian et al. |
| 6,918,101 B1 | 7/2005 | Satya et al. |
| 6,948,141 B1 | 9/2005 | Satya et al. |
| 6,959,104 B2 | 10/2005 | Rajagopal et al. |

(Continued)

OTHER PUBLICATIONS

Lerner, J., "The Two-Edged Sword: The Competitive Implications of Financial Patents," Federal Reserve Board of Atlanta's 2003 Financial Markets Conference, 2003, pp. 1-40.

*Primary Examiner*—Stacy A Whitmore
(74) *Attorney, Agent, or Firm*—Gibb I.P. Law Firm, LLC; Ryan K. Simmons, Esq.

(57) ABSTRACT

Disclosed herein are embodiments of a system and an associated method for analyzing an integrated circuit to determine the value of a particular attribute (i.e., a physical or electrical property) in that integrated circuit. In the embodiments, an open deterministic sequencing technique is used to select a sequence of points representing centers of sample windows in an integrated circuit layout. Then, the value of the particular attribute is determined for each sample window and the results are accumulated in order to infer an overall value for that particular attribute for the entire integrated circuit layout. This sequencing technique has the advantage of allowing additional sample windows to be added and/or the sizes and shapes of the windows to be varied without hindering the quality of the sample.

20 Claims, 6 Drawing Sheets

U.S. PATENT DOCUMENTS

| | | |
|---|---|---|
| 7,071,938 B2 | 7/2006 | Herken et al. |
| 7,143,371 B2 | 11/2006 | Allen et al. |
| 2005/0108669 A1 | 5/2005 | Shibuya |
| 2005/0240839 A1 | 10/2005 | Allen et al. |
| 2005/0275653 A1 | 12/2005 | Keller |
| 2005/0275660 A1 | 12/2005 | Keller |
| 2006/0150130 A1 | 7/2006 | Allen et al. |
| 2006/0190222 A1 | 8/2006 | Allen et al. |
| 2006/0190223 A1 | 8/2006 | Allen et al. |
| 2006/0190224 A1 | 8/2006 | Allen et al. |

METHOD AND SYSTEM FOR ANALYZING AN INTEGRATED CIRCUIT BASED ON SAMPLE WINDOWS SELECTED USING AN OPEN DETERMINISTIC SEQUENCING TECHNIQUE

BACKGROUND

1. Field of the Invention

The embodiments of the invention generally relate to integrated circuit analysis and, more particularly, to a system and method for computing a value of a particular attribute of an integrated circuit based on accumulated results of data analysis from sample windows, where the sample windows are selected from the integrated circuit layout using an open deterministic sequencing technique.

2. Description of the Related Art

In the past the techniques used to analyze the layout and/or electrical properties of an integrated circuit often entailed analyzing the entire chip and not samples thereof. For example, Voronoi-based techniques are often used to map out a full-chip and compute the critical area defect mechanisms on the chip (e.g., as illustrated in the following U.S. patents and Published U.S. patent applications incorporated herein by reference: U.S. Pat. No. 6,044,208 issued to Papadapoulou et al. on Mar. 28, 2000; U.S. Pat. No. 6,718,539 issued to Papadapoulou et al. on Jan. 23, 2001; U.S. Pat. No. 6,247,853 issued to Papadapoulou et al. on Jun. 19, 2001; U.S. Pat. No. 6,317,859 issued to Papadapoulou et al. on Nov. 13, 2001; U.S. Pat. No. 7,143,371 issued to Allen et al. on Nov. 28, 2006; U.S. Patent Application Publication No. 2005/0240839 of Allen et al. published Oct. 27, 2005; and U.S. Patent Application Publication No. 2006/0150130 of Allen et al. published Jul. 6, 2006). However, as technology advances and design size increases full-chip analyses have become prohibitively time-consuming.

SUMMARY

In view of the foregoing, disclosed herein are embodiments of a system, a service, and an associated method for analyzing an integrated circuit to determine the value of a particular attribute (i.e., a physical or electrical property) in that integrated circuit. In the embodiments, an open deterministic sequencing technique is used to select a sequence of points representing centers of sample windows in an integrated circuit layout. Then, the value of the particular attribute is determined for each sample window and the results are accumulated in order to infer an overall value for that particular attribute for the entire integrated circuit layout.

More particularly, embodiments of the system of the invention comprise a sequence generator (i.e. a first processor), a measuring tool and data analyzer (i.e., at least one second processor). The sequence generator is adapted to deterministically generate a sequence of points on an integrated circuit (i.e., on an integrated circuit layout), where the sequence has a defined number of points. This sequence can, for example, be generated such that each point in the sequence is selected relative to all previously selected points and such that distribution of these points across the integrated circuit remains approximately uniform as additional points are added.

In order to generate the sequence of points in this manner, the sequence generator can be adapted to select a first point on the integrated circuit (e.g., randomly). The sequence generator can further be adapted to select the second point relative to the first point (e.g., such that the first point and the second point are maximally separated). Next, the sequence generator can be adapted to select a third point relative to both the first and second points (e.g., such that the third point is maximally separated from both the first point and the second point). The sequence generator can be adapted to continuously select additional points on the integrated circuit relative to all of the other previously selected points (e.g., such that each of the additional points is maximally separated from all other points on the integrated circuit). This process continues until the defined number of points is reached. These points, once selected, represent the center points for sample windows in the integrated circuit layout.

The measuring tool can be adapted to receive the sequence of points along with defined sizes and shapes for each of the sample windows. The measuring tool can further be adapted to obtain the data necessary to determine a particular attribute (e.g., a physical property such as critical area, layout density, quantity of features, feature perimeter, feature length, feature area, feature thickness, etc., or an electrical property such as resistance, capacitance, etc.) in each of the sample windows.

The data analyzer can be adapted to receive this data and to determine, based on the measured data, a value for the particular attribute in each of the sample windows (i.e., window-level values for the attribute). The data analyzer can further be adapted to compute (i.e., infer) the overall value for the attribute in the integrated circuit as a weighted average of the window-level values, where weighting is based on the sample window sizes and shapes (i.e., the sample window area).

Upon determination of the overall value, the data analyzer can further be adapted to determine if some predetermined time-based or results-based stopping criterion has not been met and, if not the process of sampling points by the sequence generator and computing the overall value for the attribute by the data analyzer can continue. Specifically, the system is closed-looped so that, if the predetermined stopping criterion has not been met the sequence generator is adapted to increase the defined number of points for sample windows to a new defined number and to continue to deterministically generate the sequence of the points until the new number is reached. Furthermore, if a new number of points is defined, the measuring tool is adapted to obtain the required data from the new sample windows in the sequence and the data analyzer is adapted to re-determine the window-level values for the attribute as well as to re-compute the overall value for the attribute in the same manner as described above.

Also, disclosed are embodiments of a method of the invention as well as a program storage device readable by computer and tangibly embodying a program of instructions executable by that computer to perform the method embodiments.

In these embodiments, a sequence of points with a defined number is generated on an integrated circuit (i.e., on an integrate circuit layout), using an open deterministic sequencing technique. The technique can optionally be tailored so that distribution of the points across the integrated circuit is approximately uniform and so that each point in the sequence is selected relative to all previously selected points.

For example, in order to generate a sequence of points in this manner the method can comprise selecting a first point on the integrated circuit. Selection of the first point can be random, based on user-input or by default. Next, a second point on the integrated circuit can be selected relative to the first point (e.g., such that the first point and the second point are maximally separated). Once the second point is selected, a third point on the integrated circuit can be selected relative to both the first and second points (e.g., such that the third point is maximally separated from both the first point and the second point). Until the defined number of points is reached, additional points are continuously selected in this same manner (e.g., such that each additional point is maximally separated from all other previously selected points on the integrated circuit). The points in the sequence represent centers of corresponding sample windows.

In addition to deterministically generating the sequence of points on the integrated circuit, the sizes and shapes of the sample windows corresponding to each point are also defined. Each sample window can be defined to have the same size and shape, or different sizes and shapes. For example, each window can be individually defined so that in light of the integrated circuit design, its size and shape are reasonably sufficient to capture certain properties in the specific location on the integrated circuit and, thereby to allow the particular attribute to be accurately determined for the sample window. Additionally, if, during subsequent testing, a determination is made that the shape and/or size of a given sample window is not sufficient to capture the property being measured, then the defined size and/or shape of a particular sample window can be varied in order to more accurately determine the value of the particular attribute in that sample window.

After the sequence of points for the sample windows is generated and the sample window sizes and shapes are defined, data can be collected. Specifically, conventional data collection techniques can be used to collect data from each sample window. The collected data is that data which is required in order to determine the value of a particular attribute in each of the sample windows. For purposes of illustration, net tracing techniques can be used to collect data from each sample window in order to determine critical area using Voronoi diagrams. However, those skilled in the art will recognize that the embodiments of the invention are equally suited for incorporating other data collection techniques suitable for acquiring the data necessary to determine other attributes, such as physical parameters (e.g., layout density, quantity of features, feature perimeter, feature length, feature area, feature thickness, etc.) or electrical parameters (e.g., resistance, capacitance, etc.).

Once the data is collected from each sample window, the value for the particular attribute in each of the sample windows can be determined. Specifically, using the same techniques which would conventionally be used to determine the value for that attribute over the entire integrated circuit, measured data from each individual sample window is used to determine the value of the attribute in each the windows. Then, the overall value for the attribute in the integrated circuit as a whole can be computed (i.e., inferred) as a weighted average of the window-level values, where the weighting is based on the sample window sizes and shapes.

After the overall value for the attribute is computed, a determination can also be made as to whether or not a predetermined stopping criterion (e.g., a time-based or results-based stopping criterion) has been met. If it has been met, the sequence generation and analysis processes will cease. However, if the stopping criterion not been met, the number of points in the sequence is increased to a new defined number and the processes iteratively loop. That is, once the sequence size is increased (i.e., once the newly defined number of points in the sequence is achieved), window sizes and shapes can be defined for the windows corresponding to the new points, data can be collected for the new sample windows, the window-level values for the attribute for the new sample windows can be determined, and the overall value for the attribute can be re-computed, all in the same manner as discussed above.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
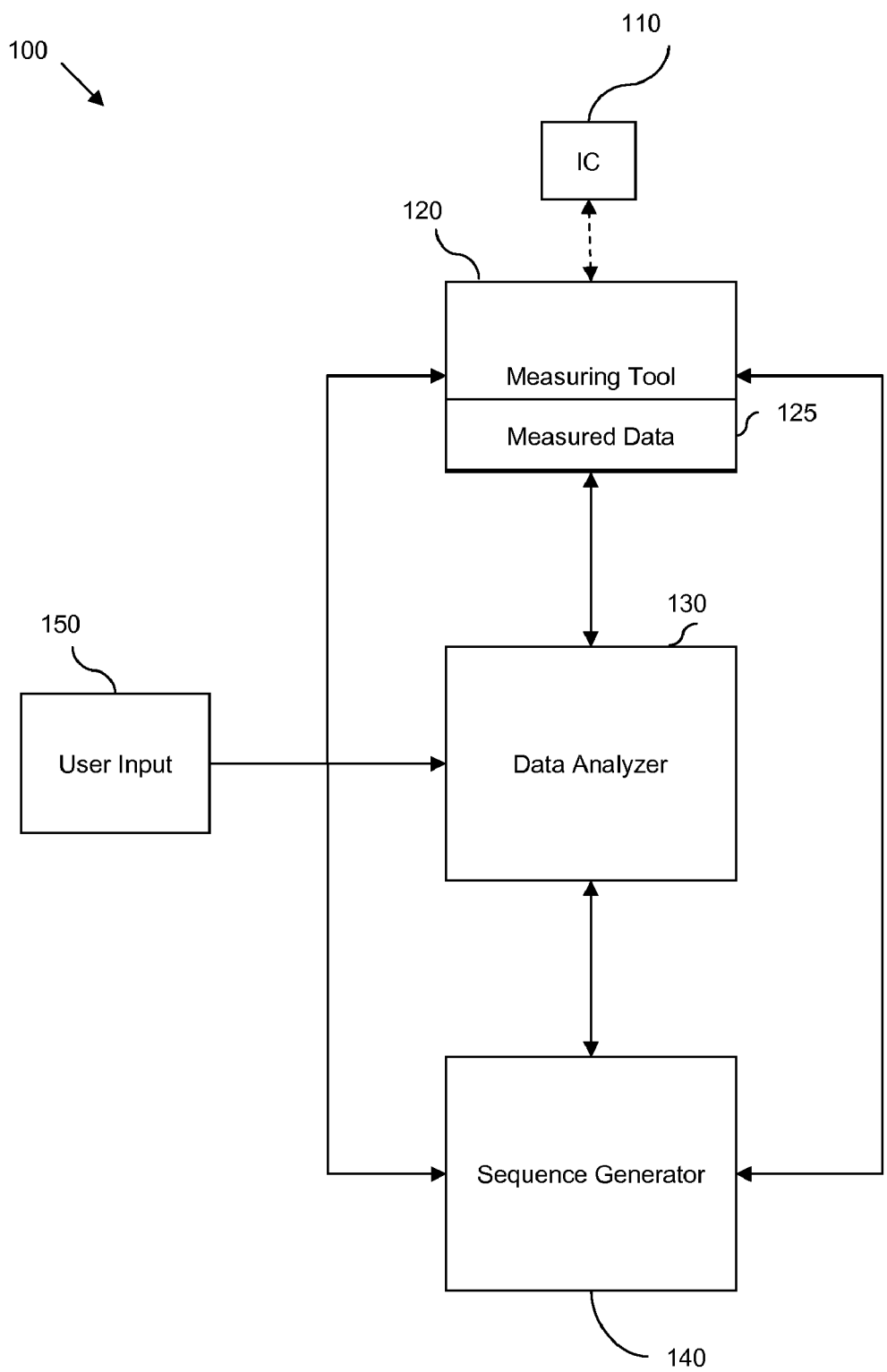
FIG. 1 is a block diagram illustrating an embodiment of the system of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, as technology advances and design size increases full-chip analyses (e.g., to determine attributes, such as critical area) have become prohibitively time-consuming. In view of the foregoing, disclosed herein are embodiments of a system and an associated method for analyzing an integrated circuit to determine the value of a particular attribute (i.e., a physical or electrical property) in that integrated circuit. In the embodiments, an open deterministic sequencing technique is used to select a sequence of points representing centers of sample windows in an integrated circuit layout. Then, the value of the particular attribute is determined for each sample window and the results are accumulated in order to infer an overall value for that particular attribute for the entire integrated circuit layout.

Figure 2:
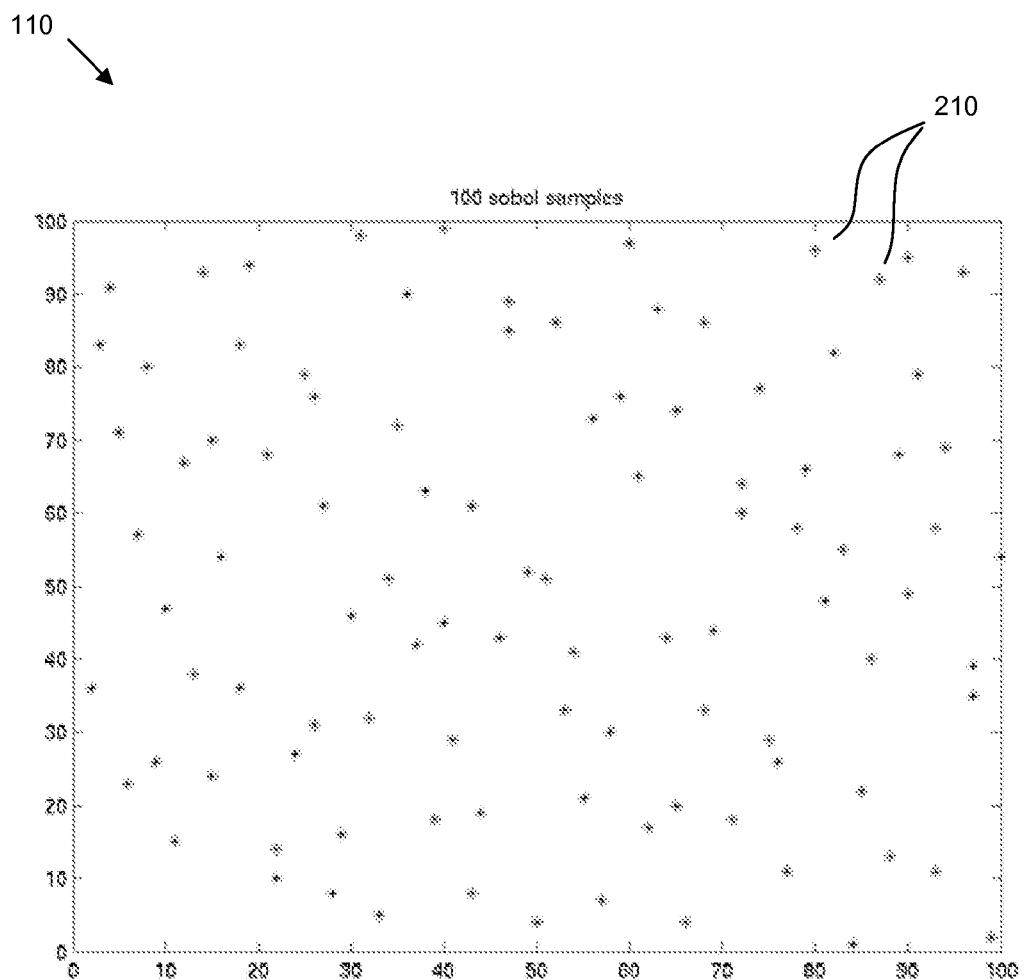
FIG. 2 is an exemplary diagram illustrating points on an integrated circuit selected using a deterministic sequencing technique.

Referring to FIGS. 1 and 2 in combination, embodiments of the system 100 comprise a sequence generator 140 (i.e., a first processor), a measuring tool 120 and a data analyzer 130 (i.e., at least one second processor). The sequence generator 140 can be adapted to deterministically generate a sequence of points 210 on an integrated circuit 110 (i.e., on an integrated circuit layout). These points 210 can represent centers of sample windows of the integrated circuit 110 being tested.

The measuring tool 125 can be adapted to receive the sequence of points 210 on the integrated circuit 110 (i.e., on the integrated circuit layout). Additionally, the measuring tool 125 can be adapted to receive a defined size and shape of each sample window. This measuring tool 120 can be any conventional measuring tool that can be used to obtain the measured data 125 required to determine the value of a particular attribute from each of the sample windows, as defined by the points, sizes and shapes. For purposes of illustration, the measuring tool 120 can comprise net tracing technology and the collected data 125 can be used to determine critical area using Voronoi diagrams, as disclosed in the Papadapoulou et al. documents referenced above and incorporated by reference. However, those skilled in the art will recognize that the embodiments of the invention are equally suited for incorporating different types of measuring tools 120 for acquiring the different types of data 125 that may be necessary to determine different attributes, such as physical parameters (e.g., layout density, quantity of features, feature perimeter, feature length, feature area, feature thickness, etc.) or electrical parameters (e.g., resistance, capacitance, etc.). The referenced features may include, but are not limited to, devices, vias, wires, etc.

The data analyzer 130 (i.e., the at least one second processor) is adapted to receive the measured data 125 and to use the data 125 to determine the value of the attribute for each of the sample windows. That is, the data analyzer 130 is adapted to determine, based on the measured data collected, window-level values for the attribute (e.g., by generating separate Voronoi diagrams in each sample window). Finally, the data analyzer 130 is adapted to accumulate the window-level attribute values in order to compute (i.e., infer) the overall value for the attribute in the integrated circuit. That is, based on a weighted average of the window-level values for the attribute, the data analyzer 130 will determine the value for the attribute in the entire integrated circuit. Weighting is based on the defined sizes and shapes of the sample windows.

More particularly, the initial number of points defined for the sequence can be based on user input 150 (e.g., could be application specific based on the type of attribute being measured and the required sequence size to achieve sufficient results) or can be defined by default (e.g., all sequence sizes initially begin with 1024 points). Referring to FIG. 2 in combination with FIG. 1, the sequence generator 140 is adapted to use an open deterministic sequencing to automatically and deterministically generate a sequence of points 210 on an integrated circuit 110 layout such that selection of the points in the sequence is relative to all previously selected points until the defined number of points for the sequence is achieved. For example, the deterministic generation of the sequence of points can be performed such that distribution of these points across the integrated circuit 110 is approximately uniform. Deterministic refers to the fact that the sequencing is not random and open refers to the fact that the sequence properties (e.g., uniformity) are maintained as each new point (new sample window) is added to a sequence. Thus, for example, the sequence of points can have low-discrepancy between the points (i.e., there will be minimal clumping of points, minimal clustering of points, maximal gaps between points, etc.). This open deterministic technique can be used as opposed to random or grid-based or closed sequences to ensure the incremental quality of the sample and to maximize uniformity.

Figure 3:
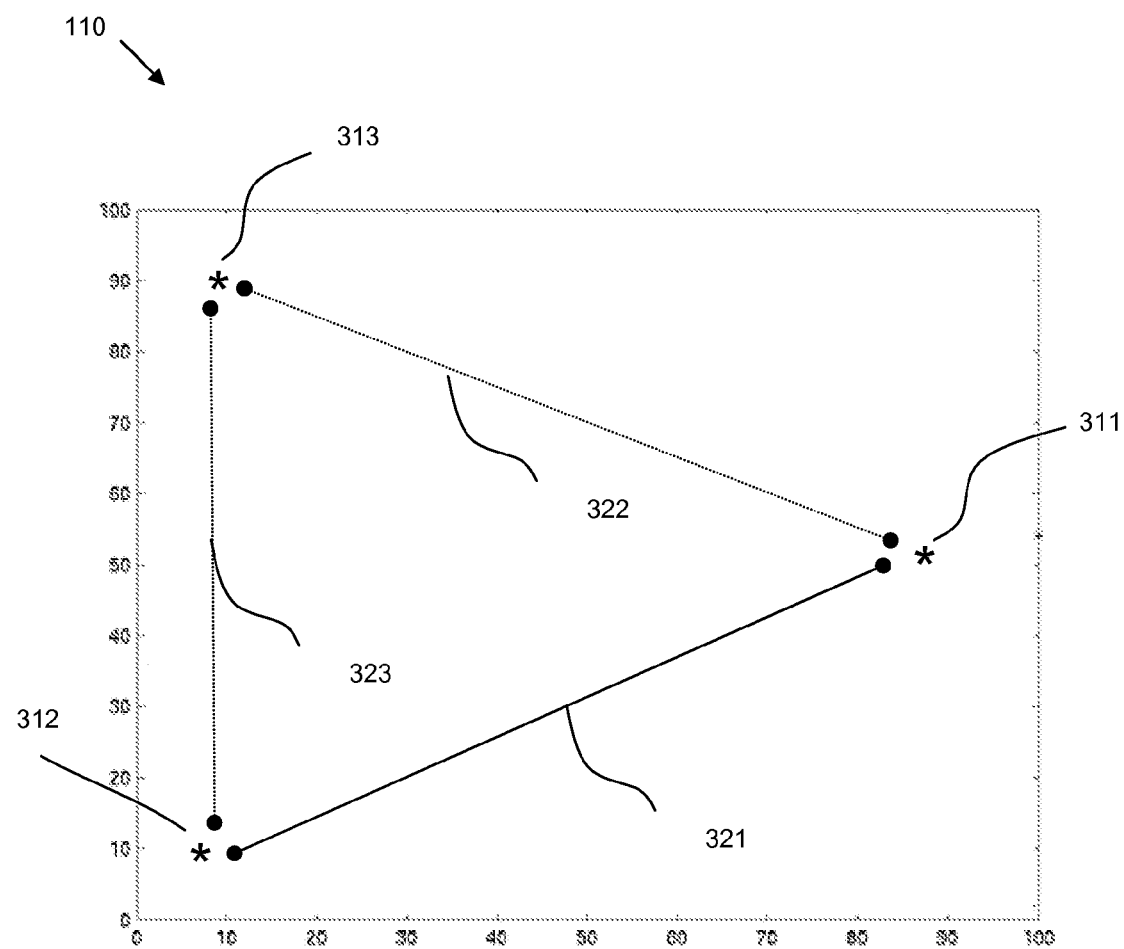
FIG. 3 is an exemplary diagram illustrating the deterministic sequencing technique of FIG. 2.

Referring to FIG. 3 in combination with FIG. 1, in order to accomplish deterministic generation of the sequence of points in the manner described above, the sequence generator 140 can be adapted to select the first point 311. Specifically, the sequence generator 140 can randomly select the first point location 311. The sequence generator 140 can also select the first point 311 based on user-input 150. Alternatively, the sequence generator 140 can select the first point 311 by default (e.g., the sequence generator can be programmed to always select as the first point the center point of the integrated circuit, a corner of the integrated circuit, etc.).

The sequence generator 140 can further be adapted to select a second point 312 deterministically. Specifically, the sequence generator 140 can be adapted to select the second point 312 on the integrated circuit 110 relative to the first point 311. For example, the second point 312 can be selected such that the first point 311 and the second point 312 are maximally separated. That is, the second point 312 can be selected such the first and second points 311-312 are separated on the integrated circuit 110 by the greatest possible distance 321. Next, the sequence generator 140 can be adapted to select a third point 313 on the integrated circuit 110 relative to the first and second points 311-312 (e.g., such that the third point 313 is maximally separated from both the first point 311 and the second point 312 (see distances 322 and 323)). Finally, the sequence generator 140 is adapted to continuously select additional points on the integrated circuit 110 relative to all other previously selected points (e.g., such that each of the additional points is maximally separated from all other previously selected points on the integrated circuit 110). This sequence generation process (i.e., the point selection process) continues until the initial defined number of points is reached. Once the sequence of points on the integrated circuit is generated, this information is communicated to the appropriate measuring tool 125.

Figure 4:
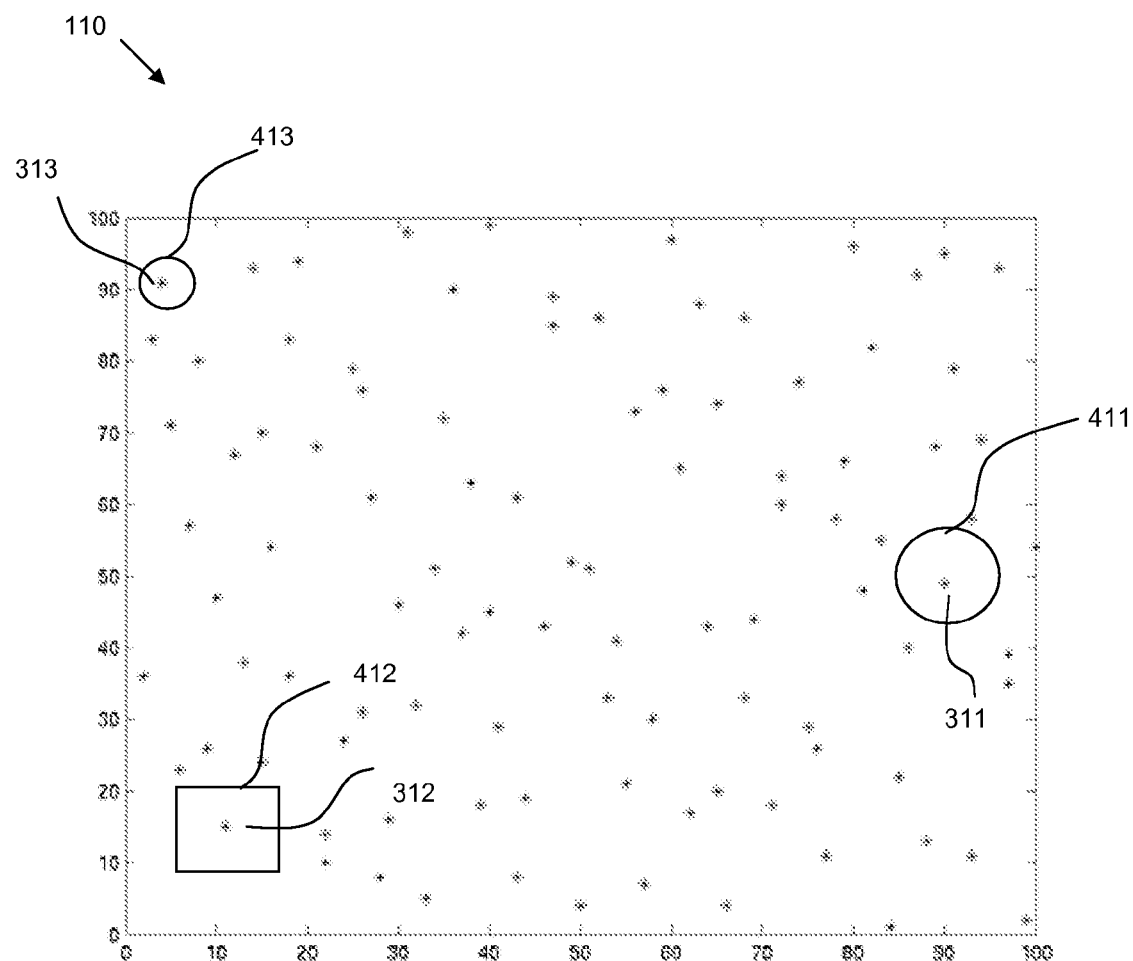
FIG. 4 is an exemplary diagram illustrating exemplary sample windows.

Also communicated to the measuring tool 120 are the defined sizes and shapes of the sample windows corresponding to each point. That is, the measuring tool 120 is adapted to receive the sequence of points along with the defined sizes and shapes of the corresponding sample windows. Specifically, referring to FIG. 4 in combination with FIG. 1, the sizes and shapes of the sample windows (e.g., 411-413) around each corresponding center point (e.g., 311-313) must be defined and communicated to the measuring tool 120. The size and shape of each window can be user-defined and, for example, can be communicated directly to the measuring tool 120 via user input 150. Alternatively, the data analyzer 130 can be adapted to determine and communicate the optimal size and shape for each sample window (e.g., based on user input, based on the property being measured, etc.). Additionally, each window can be defined to have the same size and shape or different sizes and shapes. For example, each window can be individually defined so that in light of the integrated circuit design, its size and shape are reasonably sufficient to capture certain properties (e.g., net-tracing) in the specific location on the integrated circuit and, thereby to allow the particular attribute to be accurately determined for the sample window (e.g., in order to accurately calculate critical area within the sample window). It should be noted that if, during subsequent testing (i.e., when data is measured), a user or the data analyzer determines that the shape and/or size of a given sample window is not sufficient to capture the property being measured, then a change to the size and/or shape of the sample window can be made and communicated to the measuring tool 120. That is, the measuring tool 120 can be instructed (e.g., by either user input directly or via the data analyzer) to vary the defined size and/or shape of a particular sample window in order to more accurately determine the value of the particular attribute in that sample window.

As discussed above, the measuring tool 120 can be any conventional measuring tool that is adapted to obtain the measured data 125 required to determine a particular attribute. Knowing the locations of the center points on the integrated circuit layout and the sizes and shapes of the corresponding sample windows, the measuring tool 120 can obtain the required data 125 necessary for determining the attribute in each of the individual sample windows.

The data analyzer 130 can be adapted to receive the measured data 125 from the measuring tool 125. That is, the collected data 125 can be accessed by or communicated to the data analyzer 130. The data analyzer 130 can further be adapted to use this data in order to determine the value of the attribute in each of the sample windows. That is, based on the collected data 125 from the measuring tool 120 and using the same techniques which would otherwise be used to determine the value of the attribute for the entire chip, the data analyzer 130 will determine window-level values for the attribute. For example, based on net tracing data obtained from each sample window, the data analyzer 130 can generate a separate Voronoi diagram of each sample window to determine the critical area in each sample window. Finally, the data analyzer 130 can be adapted to accumulate the window-level attribute values from each window to compute (i.e., to infer) the overall value for the attribute in the integrated circuit 110. Specifically, based on a weighted average of the window-level values for the attribute, the data analyzer 130 can be adapted to compute the overall value for the attribute in the integrated circuit. Weighting can be based on the sample window sizes and shapes (i.e., the window area).

Referring again to FIG. 1, the data analyzer 130 can further be adapted to determine if some predetermined stopping criterion has or has not been met. If the criterion has been met, all sequence generation and analysis can cease. However, if the stopping criterion has not been met, then sequence generation by the sequence generator, measuring by the measuring tool and computing the window-level values and overall value for the attribute by the data analyzer can continue. Specifically, the sequence generator 140 can further be adapted to increase the defined number of points in the sequence to a new defined number (e.g., to increase the number of points by a user-determined or default amount) and to continue generating the sequence of points until the new number is reached, if the data analyzer 130 determines that the stopping criterion has not been met. For example, if the number of points in the sequence is initially defined at 1000 and if the stopping criterion has not been met, then the defined number of points for the sequence can be increased by 100 (i.e., a new defined number of 1100) and the additional points in the sequence can be using the same automatic deterministic sequencing technique described above. That is, each additional point on the integrated circuit can be selected relative to all other previously selected points in the sequence (e.g., in order to provide maximal separation from all other previously selected points on the integrated circuit). Thus, the deterministic sequencing technique used can allow the sequence size to be incrementally increased while still ensuring that the distribution of the points across the integrated circuit is approximately uniform. Additionally, due to this incremental quality, for any defined number of points for a sample, if generation of the sequence of points must suddenly be terminated, coverage across the integrated circuit will still be approximately uniform.

The system 100 is closed-looped so that, if a new number of points in the sequence is defined, the measuring tool 120 will obtain the required data from the new sample windows corresponding to the additional points and the data analyzer 130 will re-determine the window-level values for the attribute as well as re-compute the overall value for the attribute in the same manner as described above.

The stopping criterion, upon which continuation or cessation of the sampling and analysis processes is based, can comprise either a time-based stopping criterion or a results-based stopping criterion. For example, a time-based stopping criterion can comprise a stop time (e.g., complete all analysis by a given time), a time-period (e.g., analyze the integrated circuit for a maximum amount of time, etc. A results-based stopping criterion can comprise achievement of some threshold of consistency (e.g., if after 3 overall computations, the value for the attribute is approximately equal, then the sampling process can be terminated).

Figure 5:
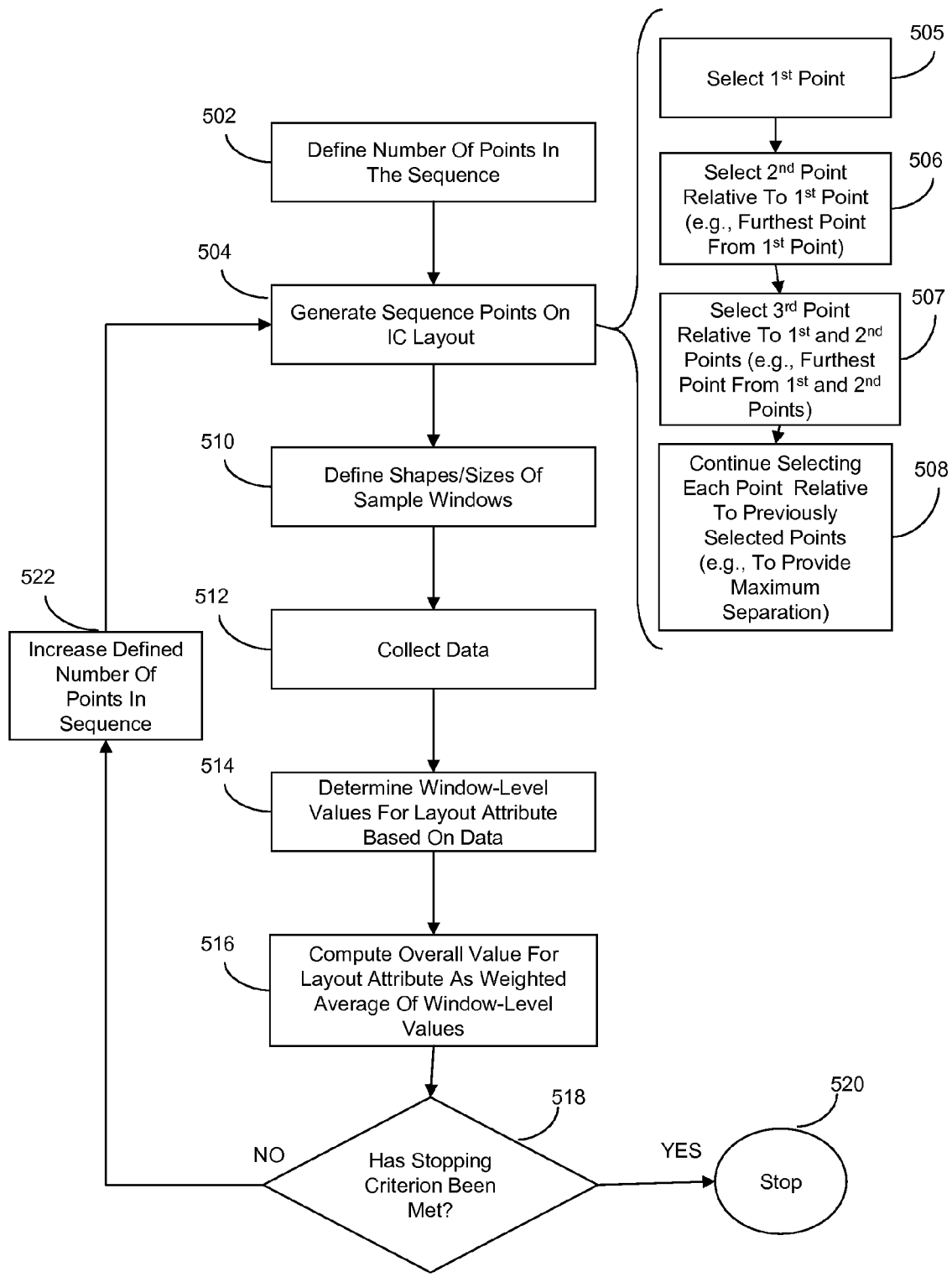
FIG. 5 is a flow diagram illustrating an embodiment of the method of the invention.

Also, referring to FIG. 5, disclosed are embodiments of a method of the invention as well as a program storage device readable by computer and tangibly embodying a program of instructions executable by that computer to perform the method embodiments.

In these embodiments, a number of points for a sequence are defined (502) and the sequence of points is automatically generated on an integrated circuit (i.e., on an integrated circuit layout) using an open deterministic sequencing technique. Deterministic refers to the fact that the sequencing is not random and open refers to the fact that the sample properties (e.g., uniformity) are maintained as each new point (new sample window) is added to a sample. For example, the sequencing can be such that distribution of the points 210 across the integrated circuit 110 is approximately uniform and such that each point selected is positioned relative to all previously selected points (504, see FIG. 2). This open deterministic sequencing technique can be used as opposed to random or grid-based or closed sequences to ensure the incremental quality of the sample and to maximize uniformity.

For example, as illustrated in FIG. 3, in order to generate the sequence of points in this manner the method can comprise selecting a first point 311 on the integrated circuit (505). Selection of the first point 311 can be random, based on user-input or by default (e.g., programmed to always be the center point of the integrated circuit, a specific corner of the integrated circuit, etc., unless otherwise directed).

Next, a second point 312 on the integrated circuit 110 can be deterministically selected (508). Specifically, the second point 312 can be selected relative to the first point 311. For example, the second point 312 can be selected such that the first point 311 and the second point 312 are maximally separated (i.e., such that the first and second points are separated on the integrated circuit by the greatest possible distance).

Once the second point 312 is selected, the third point 313 on the integrated circuit 110 can be selected relative to both the first and second points 311-312 (e.g., such that the third point 313 is maximally separated from both the first point 311 and the second point 312) (507). Until the defined number of points in the sequence is reached, additional points are continuously selected such that each additional point is selected relative all other previously selected points on the integrated circuit (e.g., such that each additional point is maximally separated from all other previously selected points on the integrated circuit) (508). These points, once selected, represent centers of corresponding sample windows, which, when combined, comprise the sample of the integrated circuit to be analyzed.

In addition to generating the sequence of points on the integrated circuit, the sizes and shapes of the sample windows corresponding to each point are also defined (510). Specifically, the sizes and shapes of the corresponding sample windows (e.g., 411-413) around each center point (e.g., 311-313) must be defined and communicated along with the sequence of points to a measuring tool 120 (see FIG. 4). Each sample window can be defined to have the same size and shape or different sizes and shapes. For example, each window can be individually defined so that in light of the integrated circuit design, its size and shape are reasonably sufficient to capture certain properties (e.g., net-tracing) in the specific location on the integrated circuit and, thereby, to allow the particular attribute to be accurately determined for the sample window (e.g., in order to accurately calculate critical area within the sample window). It should be noted that if, during subsequent testing (i.e., when data is measured), a determination is made that the shape and/or size of a given sample window is not sufficient to capture the property being measured, then the defined size and/or shape of a particular sample window can be varied in order to more accurately determine the value of the particular attribute in that sample window.

After all of the points are selected and the sample window sizes and shapes are defined, data can be collected (512). Specifically, conventional data collection techniques can be used to collect data from each sample window. The data collected is that data which is required in order to determine the value of a particular attribute in each of the sample windows.

For purposes of illustration, net tracing techniques can be used to collect data from each sample window in order to determine critical area using Voronoi diagrams, as disclosed in the Papadopoulou et al. documents referenced above and incorporated herein by reference. However, those skilled in the art will recognize that the embodiments of the invention are equally suited for incorporating other data collection techniques suitable for acquiring the different types of data that are necessary to determine different attributes, such as physical parameters (e.g., layout density, quantity of features, feature perimeter, feature length, feature area, feature thickness, etc.) or electrical parameters (e.g., resistance, capacitance, etc.). The referenced features may include, but are not limited to, devices, vias, wires, etc.

Once the data is collected from each sample window, the value for the particular attribute in each of the sample windows can be determined (i.e., window-level values for the attribute can be determined) (514). Specifically, using the same techniques which would conventionally be used to determine the value for that attribute over the entire integrated circuit, measured data from each individual sample window is used to determine the value of the attribute in each the windows (i.e., used to determine window-level values for the attribute). For example, as mentioned above, net tracing data from each sample window can be used to generate a Voronoi diagram for each window and, thereby, to determine the critical area of each window. Then, the overall value for the attribute can be computed as a weighted average of the window-level values, where the weighting is based on the sample window sizes and shapes (i.e., the window area) (516)

After the overall value for the attribute is determined, a determination can also be made as to whether or not a predetermined stopping criterion (e.g., a time-based or results-based stopping criterion, see discussion above) has been met (518). If it has been met, the sampling and analysis processes will cease (520). However, if the stopping criterion not been met, the number of points in the sequence is increased to a new defined number (522) and the processes iteratively loop. Specifically, if the predetermined stopping criterion is not met, the defined number of points in the sequence is increased by a predetermined amount (e.g., a user-determined or default amount). For example, if the number of points in the sequence is initially defined at 1000 and if the stopping criterion has not been met, then the defined number of points for the sequence can be increased by 100 to a new defined number of 1100 and the additional points can be added to the sequence using the same deterministic sequencing technique described above (see 504). That is, until the new number of points is reached, additional points on the integrated circuit are continuously selected relative to the previously selected points (e.g., so as to provide maximum separation from all previously selected points on the integrated circuit). Thus, the sequencing technique used allows the sequence size to be incrementally increased while still ensuring that the distribution of the points across the integrated circuit is approximately uniform. Additionally, due to this incremental quality, for any defined number of points for a sequence, if the process of selecting points in the sequence must suddenly be terminated, coverage across the integrated circuit can still be approximately uniform.

Once the sequence size is increased (i.e., once selection of the newly defined number of points in the sequence is achieved), window sizes and shapes can be defined for the windows corresponding to the new points (510), data can be collected for the new sample windows (512), the window-level values for the attribute for the new sample windows can be determined (514), and the overall value for the attribute can be re-computed in the same manner as discussed above (516).

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
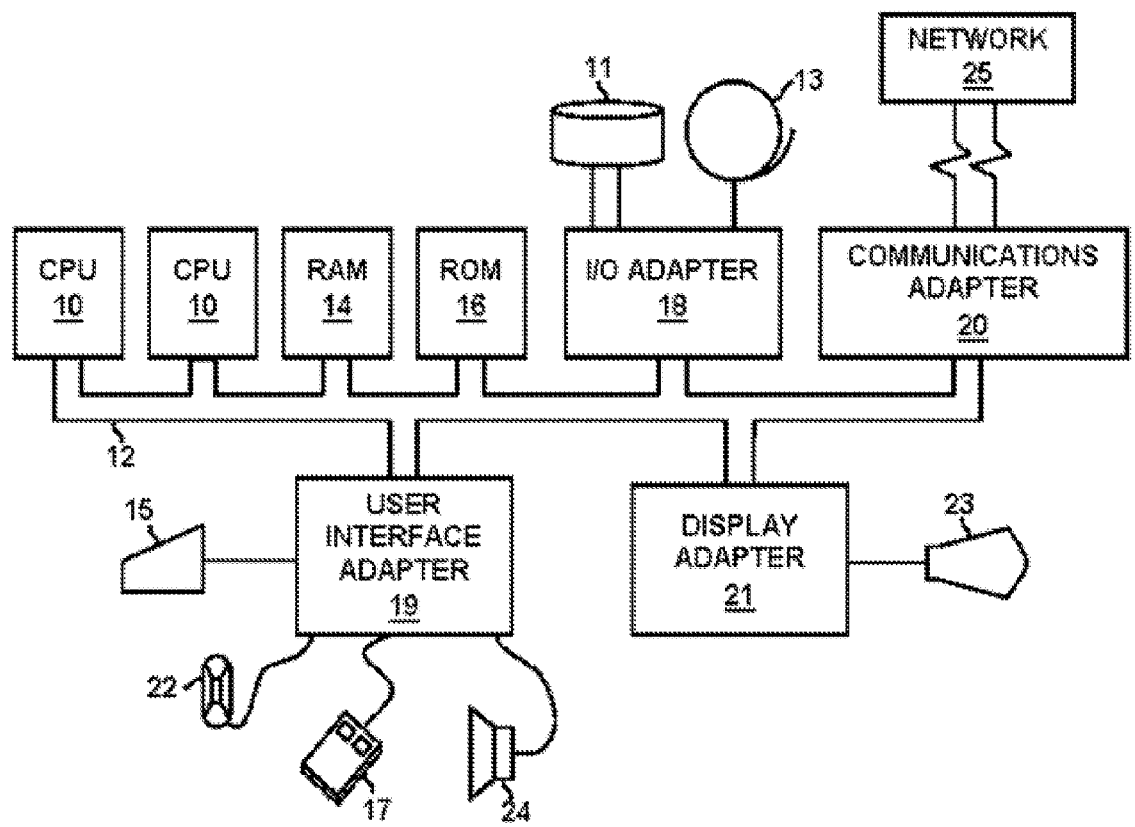
FIG. 6 is a schematic representation of a computer system suitable for use in conjunction with the embodiment described herein.

A representative hardware environment for practicing the embodiments of the invention is depicted in FIG. 6. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

In view of the foregoing, disclosed herein are embodiments of a system and an associated method for analyzing an integrated circuit to determine the value of a particular attribute (i.e., a physical or electrical property) in that integrated circuit. In the embodiments, an open deterministic sequencing technique is used to select a sequence of points representing centers of sample windows in an integrated circuit layout. Then, the value of the particular attribute is determined for each sample window and the results are accumulated in order to infer an overall value for that particular attribute for the entire integrated circuit layout. This sequencing technique has the advantage of allowing additional sample windows to be added and/or the sizes and shapes of the windows to be varied without hindering the quality of the sample.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A system for analyzing an integrated circuit, said system comprising:
   a sequence generator adapted to deterministically generate a sequence of points on said integrated circuit,
   wherein said sequence comprises a defined number of said points,
   wherein said points represent centers of sample windows, and
   wherein said sample windows comprise defined sizes and shapes; and
   a data analyzer adapted to determine window-level values for an attribute in each of said sample windows and to further compute an overall value for said attribute in said integrated circuit, based on said window-level values.

2. The system of claim 1, wherein sequence generator is further adapted to deterministically generate said sequence such that distribution of said points across said integrated circuit is approximately uniform.

3. The system of claim 1, wherein, in order to deterministically generate said sequence, said sequence generator is adapted to:
   select a first point on said integrated circuit;
   select a second point on said integrated circuit relative to said first point;
   select a third point on said integrated circuit relative to said first point and said second point; and
   continuously select additional points on said integrated circuit relative to other previously selected points on said integrated circuit until said defined number is reached.

4. The system of claim 3, wherein said sequence generator is further adapted to deterministically generate said sequence such that each of said points is selected to be maximally separated from all of said other previously selected points.

5. The system of claim 1, wherein, to compute said overall value, said data analyzer is adapted to compute a weighted average of said window-level values.

6. The system of claim 1,
   wherein said data analyzer is further adapted to determine if a stopping criterion has not been met,
   wherein said sequence generator is further adapted to increase said defined number to a new defined number if said stopping criterion has not been met and to continue selecting said points until said new defined number is reached, and
   wherein said data analyzer is further adapted to re-compute said overall value for said attribute if said defined number is increased to said new defined number.

7. The system of claim 6, wherein said stopping criterion comprises at least one of a time-based criterion and a results-based criterion.

8. The system of claim 1, wherein said attribute comprises one of a physical parameter and an electrical parameter.

9. The system of claim 1, wherein said attribute comprises one of critical area, layout density, quantity of features, feature perimeter, feature length, feature area, resistance and capacitance.

10. A method for analyzing an integrated circuit, said method comprising:
    deterministically generating, by a sequence generator of a system, a sequence of points on said integrated circuit,
    wherein said sequence comprises a defined number of points,
    wherein said points represent centers of sample windows, and
    wherein said sample windows have defined sizes and shapes;
    analyzing, by a data analyzer of said system, each of said sample windows to determine window-level values for an attribute in each of said sample windows; and
    computing, by said data analyzer, an overall value for said attribute in said integrated circuit, based on said window-level values.

11. The method of claim 10, wherein said deterministically generating comprises generating said sequence such that distribution of said points across said integrated circuit is approximately uniform.

12. The method of claim 10, wherein said deterministically generating comprises:

selecting a first point on said integrated circuit;
selecting a second point on said integrated circuit relative to said first point;
selecting a third point on said integrated circuit relative to said first point and said second point; and
continuously selecting additional points on said integrated circuit relative to all other previously selected points on said integrated circuit until said defined number is reached.

13. The method of claim 12, wherein each of said points is selected to be maximally separated from all of said other previously selected points.

14. The method of claim 10, wherein said computing comprises computing said overall value as a weighted average of said window-level values.

15. The method of claim 10, further comprising, selectively varying said defined sizes and shapes of said sample windows.

16. The method of claim 10, further comprising:
determining if a stopping criterion has not been met; and
if said stopping criterion has not been met, increasing said defined number to a new defined number and repeating said generating, said analyzing and said computing.

17. The method of claim 16, wherein said stopping criterion comprises at least one of a time-based criterion and a results-based criterion.

18. The method of claim 10, wherein said attribute comprises one of a physical parameter and an electrical parameter.

19. A program storage device readable by computer and tangibly embodying a program of instructions executable by said computer to perform a method of analyzing an integrated circuit, said method comprising:
deterministically generating a sequence of points on said integrated circuit,
wherein said sequence comprises a defined number of points,
wherein said points represent centers of sample windows, and
wherein said sample windows have defined sizes and shapes;
analyzing each of said sample windows to determine window-level values for an attribute in each of said sample windows; and
computing an overall value for said attribute in said integrated circuit, based on said window-level values.

20. A service for analyzing an integrated circuit, said service comprising:
deterministically generating, by a sequence generator of a system, a sequence of points on said integrated circuit,
wherein said sequence comprises a defined number of points,
wherein said points represent centers of sample windows, and
wherein said sample windows have defined sizes and shapes;
analyzing, by a data analyzer of said system, each of said sample windows to determine window-level values for an attribute in each of said sample windows; and
computing, by said data analyzer, an overall value for said attribute in said integrated circuit, based on said window-level values.

* * * * *